United States Patent [19]

Longree

[11] Patent Number: 5,563,357
[45] Date of Patent: Oct. 8, 1996

[54] INSTRUMENT CARRIER AND METHOD FOR THE INSPECTION OF A DYNAMOELECTRIC MACHINE IN A GAP BETWEEN A STATOR AND A ROTOR

[75] Inventor: Alexander Longree, Mülheim an der Ruhr, Germany

[73] Assignee: Siemens Aktiengesellschaft, Munich, Germany

[21] Appl. No.: 363,285

[22] Filed: Dec. 22, 1994

Related U.S. Application Data

[63] Continuation of PCT/EP93/01474, Jun. 9, 1993, published as WO94/00738, Jan. 6, 1994, abandoned.

[30] Foreign Application Priority Data

Jun. 22, 1992 [EP]  European Pat. Off. ............... 92110503

[51] Int. Cl.⁶ .................... G01M 19/00; G01D 21/00; H02K 15/00
[52] U.S. Cl. .......................... 73/866.5; 73/865.9
[58] Field of Search ................ 73/865.8, 865.9, 73/866.5

[56] References Cited

U.S. PATENT DOCUMENTS

| | | | |
|---|---|---|---|
| 2,999,388 | 9/1961 | Herron, Jr. .................. | 73/866.5 |
| 4,255,762 | 3/1981 | Takeyasu et al. .................. | 358/100 |
| 4,699,008 | 10/1987 | Ferree et al. .................. | 73/623 |
| 4,889,000 | 12/1989 | Jaafar et al. .................. | 73/865.8 |
| 4,970,890 | 11/1990 | Jafaar et al. . | |
| 5,105,658 | 4/1992 | Jafaar et al. .................. | 73/865.8 |
| 5,110,031 | 5/1992 | Rinaldi .................. | 228/50 |

FOREIGN PATENT DOCUMENTS

| | | | |
|---|---|---|---|
| 159463 | 3/1983 | Germany .................. | 73/866.5 |
| 4132281 | 4/1992 | Germany .................. | 73/866.5 |
| 9101779 | 6/1992 | Netherlands . | |

*Primary Examiner*—Thomas P. Noland
*Attorney, Agent, or Firm*—Herbert L. Lerner; Laurence A. Greenberg

[57] ABSTRACT

A dynamoelectric machine includes a stator and a rotor. The rotor is approximately circularly cylindrically disposed relative to a main axis, is rotatable about the main axis and leaves a gap in a recess of the stator which is approximately circularly cylindrical relative to the main axis. An instrument carrier for inspecting the dynamoelectric machine can be inserted along the main axis into the gap and moved there. The instrument carrier includes a frame part which approximately annularly surrounds the main axis and on which a device for carrying out the inspection can be mounted. A multiplicity of rollers are mutually offset, as seen in a plane perpendicular to the main axis, and each is mounted on the frame part so as to be rotatable about an associated axis of rotation. The axis of rotation is aligned essentially perpendicular to the main axis. The instrument carrier can be inserted into the gap without prior removal of the rotor, and can be equipped as desired with instruments and auxiliary devices for carrying out the inspection. The instrument carrier can be moved in the gap without the risk of tilting and jamming, since it is directly supported on the stator.

26 Claims, 5 Drawing Sheets

INSTRUMENT CARRIER AND METHOD FOR THE INSPECTION OF A DYNAMOELECTRIC MACHINE IN A GAP BETWEEN A STATOR AND A ROTOR

CROSS-REFERENCE TO RELATED APPLICATION

This application is a Continuation of International Application PCT/EP93/01474, filed Jun. 9, 1993 and now abandoned.

BACKGROUND OF THE INVENTION

FIELD OF THE INVENTION

The invention relates to an instrument carrier and a method for inspection of a dynamoelectric machine including a stator and a rotor, the rotor being disposed in an approximately circularly cylindrical manner relative to a main axis, being rotatable about the main axis and leaving a gap (being usually referred to as an "air gap" irrespective of a gas atmosphere present in the machine and of an installed cooling system) in a recess of the stator being approximately circularly cylindrical relative to the main axis, and appropriate means, that is to say optical, acoustic and/or mechanical instruments as well as lamps, grippers and the like, being inserted into the gap between the stator and the rotor in order to carry out the inspection.

Ensuring the trouble-free operation of a dynamoelectric machine, in particular a large dynamoelectric machine, for example a turbo-driven generator, and the timely detection of an incipient malfunction of such a machine, require regular inspections repeated at intervals of a few months to a few years, with it always being necessary to undertake manifold examinations and tests. A possible test in that regard is the visual inspection of the appropriately accessible surfaces of the components of the machine, in particular the surfaces of the stator and the rotor. Further possible tests include examination of the components by means of ultrasound in accordance with various methods, and tests of the magnetizability of the ferromagnetic components present in any dynamoelectric machine, for example tests of yokes composed of laminations stacked one upon the other in the stators. In order to perform such tests, it is possible, for example, to determine and evaluate the influence on the yoke of weak and locally limited magnetic fields. Mention must also be made of mechanical tests, in particular strength tests and crack detections. Not the least is the desire for possibilities of being able to recover relatively small parts from the machine, for example loosened screws and the like.

Conventional methods for the inspection of dynamoelectric machines each require removal of the rotor, which is extremely time consuming and expensive, particularly in large dynamoelectric machines having an electric power output and power consumption that are typically greater than 50 MVA. In order to be able to dispense with such expensive dismantling work, a device is known which permits an instrument platform to be drawn through the gap between the stator and the rotor in a large dynamoelectric machine and which runs along guide rails or guide cables that are led through the gap from one end of the large machine to the other. However, on the basis of the conventional dimensions of larger dynamoelectric machines, the instrument platform can neither be kept free from vibrations nor be positioned with special accuracy. Moreover, the instrument platform can tilt in the gap and jam, after which it would not be possible to recover it without considerable risk to the inspected machine and hardly without the extremely expensive removal of the rotor from the stator. The use of that device is therefore very problematical.

U.S. Pat. No. 4,255,762 discloses a device for inspecting tubes, in which a probe having an optical inspection system on a support arm is introduced into the tube to be inspected. Such a device can be used in dynamoelectric machines only by accepting disadvantages, because on the basis of the conventional dimensions of the gap to be inspected it is hardly possible for the necessary support arms to be used in a vibration free manner and avoiding collisions with the stators or rotors.

The inspection of a dynamo electric machine in a gap between a stator and a rotor emerges in addition to a corresponding device from U.S. Pat. No. 4,889,000. In that case, a sliding device resembling a rail and reaching into the gap is mounted on the rotor and can move around the rotor on chains. Seated on the rail is an instrument carrier which can travel through the gap and carries various means for carrying out inspections. In that device it is problematical that special grooves are necessary on the yoke for holding and guiding the instrument carrier, and for fixing the rail on the rotor.

SUMMARY OF THE INVENTION

It is accordingly an object of the invention to provide an instrument carrier and a method for the inspection of a dynamoelectric machine in a gap between a stator and a rotor, which overcome the hereinafore-mentioned disadvantages of the heretofore-known devices and methods of this general type, which make it possible for means for carrying out the inspection to be introduced into the gap in a reliable and vibration-free manner even, and in particular, over distances on the order of magnitude of several meters, which make it possible for such means to be moved there and precisely positioned, in which there is no need for complicated guide devices, and which exclude any sort of risk of there being a need to dismantle the machine under inspection in order to recover the devices being used in the event of a malfunction occurring during the inspection.

With the foregoing and other objects in view there is provided, in accordance with the invention, in a dynamoelectric machine including a stator having a main axis and having a recess formed therein being approximately circular cylindrical relative to the main axis, and a rotor being approximately circularly cylindrically disposed relative to the main axis and being rotatable about the main axis in the recess, defining a gap in the recess between the stator and the rotor, an instrument carrier for inspecting the dynamoelectric machine, comprising an instrument carrier axis being brought into coincidence with the main axis during inspection; a frame part annularly surrounding the instrument carrier axis; inspecting means being mounted on the frame part; and a multiplicity of rollers being mounted on the frame part, being mutually offset as seen in a plane perpendicular to the instrument carrier axis, and being rotatable about axes of rotation aligned substantially perpendicular to the instrument carrier axis.

According to the invention, the instrument carrier is used for inspecting the dynamoelectric machine and therefore the instrument carrier is inserted into the gap between the stator and the rotor, so that the frame part surrounds the rotor and the rollers roll over the recess in the stator.

The means for inspecting the dynamoelectric machine can be selected from a large multiplicity of optical, acoustic and mechanical instruments for carrying out the inspection, as well as a large multiplicity of auxiliary devices such as, for example, lamps, grippers and other hydraulic or pneumatic devices and manipulators. Examples of such means are to be gathered from U.S. Pat. No. 4,889,000.

The instrument carrier is a mechanically stable unit which can travel through the air gap between the stator and the rotor of a dynamoelectric machine and in so doing can carry means for carrying out the inspection. The instrument carrier is independent of guide devices which are to be disposed outside the machine and which retain the instrument carrier on support arms, rails or the like. In this way, impairment of the instrument carrier and of the means mounted thereon due to vibrations and similar influences, are avoided. The instrument carrier can always be positioned reliably and free from vibration, and thus permits an exact and reproducible test of the stator and/or the rotor at each point of the gap. Moreover, there is no risk of the instrument carrier tilting and jamming in the gap and only being able to be recovered from the gap at considerable expense and with the acceptance of high risks.

It goes without saying that the dimensions of the instrument carrier are to be matched to the dimensions of the gap to be travelled. However, since air gaps in large dynamoelectric machines as a rule are at least approximately 3 cm high, this does not present any essential problem. Moreover, it is to be emphasized that instruments of any conceivable type are to be available with adequate miniaturization for inspection, so that the invention is not subject to any sort of limitations with regard to the desirable inspection methods. For this purpose too, reference is made to U.S. Pat. No. 4,899,000.

The instrument carrier can be equipped with a large multiplicity of instruments. Possibilities of such instruments are optical inspection devices such as, for example, video cameras, that are supplemented if required by appropriate illumination devices. Ultrasonic test devices of all sorts of types, devices for magnetic inspections and mechanical test devices for carrying out strength tests and the like also come into question. It is conceivable, furthermore, to provide mechanical manipulators, for example grippers, for recovering loose parts and/or for carrying out relatively small repairs as well as maintenance and/or cleaning work. In order to control and to operate the means serving for inspection, as well as for the purpose of applying energy to drive devices on the and/or for the instrument carrier, only flexible leads, in particular electric leads, are required, from which no impairment proceeds and which can be led through the air gap without difficulty together with the instrument carrier. These leads can be connected to a control and evaluation device, for example a small computer with appropriate interfaces, which can be positioned outside the machine to be inspected. Moreover, it is conceivable to provide the instrument carrier with pneumatic and/or hydraulic devices, in particular motors and/or grippers. Flexible pressure lines for gases and/or liquids can be used without difficulty just like electric leads. In no case does the instrument carrier require connecting elements such as, for example, rails which are difficult to manipulate.

In accordance with another feature of the invention, the frame part of the instrument carrier has an elasticity in a radial orientation relative to the main axis, so that the circumference of the frame part to be determined about the main axis can be varied by elastic deformation. In this case, the change in circumference made possible by elastic deformation is on the order of magnitude of a centimeter, in particular of at most approximately five centimeters, in relation to an instrument carrier for use in large dynamoelectric machines of the type of turbo-driven generators. The elasticity of the frame part permits it to be capable of being matched to the gap into which it is inserted as intended, with it being possible to compensate small irregularities if required. This is important because the stators of many dynamoelectric machines, in particular the stators of turbo-driven generators, are not monolithic solid bodies, but have structures, for example many stacks of laminations disposed one behind another along the main axis and separated at a distance from one another. Moreover, it is also not necessary for the surface of the recess of the stator to be in any way smooth, but rather it may have a more or less rough coating of synthetic resin or the like. The latter can hardly be avoided in particular when the stator receives a synthetic-resin impregnation in the last step of its production. Moreover, an instrument carrier having a frame part which is elastic in the above-described manner can also possibly be used in a plurality of mutually differing stators having recesses which have dimensions more or less departing from one another.

In accordance with a further feature of the invention, the elasticity of the frame part of the instrument carrier is advantageously ensured by at least one spring element which is installed in the frame part and is elastic in the tangential direction relative to the main axis. In accordance with an added feature of the invention, it is particularly advantageous if the frame part has two or three spring elements which are distributed largely uniformly about the main axis.

In accordance with an additional feature of the invention, in order to further improve the matching of the instrument carrier to the dimensions of the gap to be travelled, the frame part has at least one expansion device by means of which it can be radially expanded, and which is externally operable through associated connecting leads. In this way, before insertion into the gap, the instrument carrier can be brought to a circumference at which it does not bear fixedly overall against the recess of the stator, and can be brought into effective and loadable contact with the stator by actuating the expansion device with all of the rollers after completing insertion. In particular, the expansion device permits setting of the pressure which the rollers exert on the recess, so that the operational reliability of the instrument carrier can also be improved.

In accordance with yet another feature of the invention, the expansion device advantageously contains a pneumatic sliding device as an essential component which acts in approximately tangential direction relative to the main axis, since by means of the elasticity of the gas which is applied to it such a sliding device ensures elasticity of the frame part even after the rollers of the instrument carrier have been pressed completely against the stator.

In accordance with yet a further feature of the invention, the rollers of the instrument carrier are installed in roller frames which are present in a multiplicity and are interconnected by a multiplicity of bent rods. In this case, each roller frame carries a multiplicity of rollers disposed one behind another relative to the main axis.

In accordance with yet an added feature of the invention, the instrument carrier has between four and eight, and preferably six, roller frames.

In accordance with yet an additional feature of the invention, the connection of two roller frames to one another is performed in each case by two rods that are approximately parallel to one another.

In accordance with again another feature of the invention, each rod is formed of an elastically flexible material, with steel, light metal and composites such as glass fiber-reinforced plastics being suitable.

Any construction of the instrument carrier with roller frames and rods can be matched to gaps of different dimensions by interchanging rods. For the purpose of inspecting a multiplicity of dynamoelectric machines, it can suffice to provide an adequate number of sets of rods in addition to a set of roller frames and means for carrying out the inspections. The rods can be connected to the roller frames through easily fixable and releasable screw or snap-on connections.

In accordance with again a further feature of the invention, each roller of the instrument carrier is curved outwards belly-like in the manner of a barrel. Such a configuration avoids edges on the rollers from coming into contact with the recess in the stator and possibly damaging the latter. Again, rollers that are curved outwards belly-like are suitable, particularly in conjunction with an elastically deformable frame part, for compensating for relatively small irregularities in the surface of the stator over which the rollers are moved.

In accordance with again an added feature of the invention, the rollers are installed in the instrument carrier as paired rollers which are disposed one behind another relative to the main axis and tightly adjacent one another, so as to be designated as "double rollers". This embodiment likewise permits compensation of irregularities in the surface of the stator, which is important, in particular, in stators of large dynamoelectric machines which include a multiplicity of stacks of laminations disposed one behind another and separated from one another (as is mentioned above). If the mutual separation of paired rollers, which is preferably to be dimensioned at a few centimeters, is suitably selected, it can be ensured that one roller of each pair always rolls on a stack of laminations. If necessary, this can be further improved by suitably selecting the separation of pairs of rollers which are disposed approximately one behind another, and/or the separation of the rollers in each pair.

In accordance with again an additional feature of the invention, there is provided at least one first motor which can drive at least one roller through appropriate power-transmitting devices and is externally operable through associated connecting lines. Within the scope of this development, the instrument carrier is a self-propelled device for travelling through the gap in the dynamoelectric machine to be inspected, and is suitable, in particular, for a largely completely automated inspection or an inspection which can be carried out largely completely by a control device set up apart from the machine to be inspected.

In accordance with still another feature of the invention, the first motor is installed in a roller frame having a plurality of rollers, and all of the rollers of the roller frame can be driven by the first motor.

In accordance with still a further feature of the invention, without prejudice to other embodiments, the instrument carrier has an instrument platform which is held on the frame part and can be moved along the frame part about the main axis, and which carries the means for carrying out the inspection.

In accordance with still an added feature of the invention, the holding of the instrument platform is performed on a guide rail along which the instrument platform can be moved.

In accordance with still an additional feature of the invention, there is provided a second motor which is forcelockingly connected with the frame part, in particular with a possibly present guide rail, by means of which the instrument platform can be moved and which is externally operable through associated connecting leads.

The instrument platform, which is preferably guided on a guide rail and/or can be moved by a second motor provided especially therefor, enables movement of the means for carrying out the inspection not only in directions parallel to the main axis, but also in tangential directions about the main axis. Due to such an instrument platform, the means for carrying out the inspection can be moved at will to any desired position in the gap, rendering possible an inspection which is controlled completely externally and possibly largely completely automatically. In particular, such an instrument platform permits positional corrections of the means for carrying out the inspection in the tangential direction, and can thus correct positional inaccuracies which may have occurred during insertion of the instrument carrier into the gap. Again, the provision of the instrument platform possibly permits carrying out the inspection largely completely from an external control and evaluation device.

In accordance with another feature of the invention, the instrument carrier has a maximum thickness, to be determined in a radial direction relative to the main axis, which is smaller than ten centimeters, and in particular smaller than five centimeters. The instrument carrier is thus suitable for a large multiplicity of dynamoelectric machines, since in any case the air gaps in dynamoelectric machines of the type of turbo-driven generators are always a few centimeters to approximately ten centimeters high and thus permit insertion of the instrument carrier for the purpose of inspection.

With the objects of the invention in view, there is also provided a method for inspecting a dynamoelectric machine including a stator having a main axis and having a recess formed therein being approximately circular cylindrical relative to the main axis, and a rotor being approximately circularly cylindrically disposed relative to the main axis and being rotatable about the main axis in the recess, defining a gap in the recess between the stator and the rotor, the improvement which comprises mounting inspecting means on a frame part of an instrument carrier having an axis being annularly surrounded by the frame part; mounting a multiplicity of rollers on the frame part, with a mutual offset as seen in a plane perpendicular to the instrument carrier axis; inserting the instrument carrier into the gap between the stator and the rotor while surrounding the rotor with the frame part; bringing the instrument carrier axis being into coincidence with the main axis during inspection; and rolling the rollers over the stator in the recess while rotating the rollers about axes of rotation aligned substantially perpendicular to the instrument carrier axis.

In accordance with another mode of the invention, there is provided a method which comprises driving the instrument carrier along the main axis with a motor of the instrument carrier being externally operable through an associated connecting lead.

In accordance with a further mode of the invention, there is provided a method which comprises mounting the inspecting means on an instrument platform of the instrument carrier, and driving the instrument platform about the main axis with a motor being operated externally through an associated connecting lead.

In accordance with a concomitant mode of the invention, there is provided a method which comprises mounting the inspecting means on an instrument platform of the instrument carrier, and driving the instrument platform about the main axis with another motor being operated externally through an associated connecting lead.

Other features which are considered as characteristic for the invention are set forth in the appended claims.

Although the invention is illustrated and described herein as embodied in an instrument carrier and a method for the inspection of a dynamoelectric machine in a gap between a stator and a rotor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
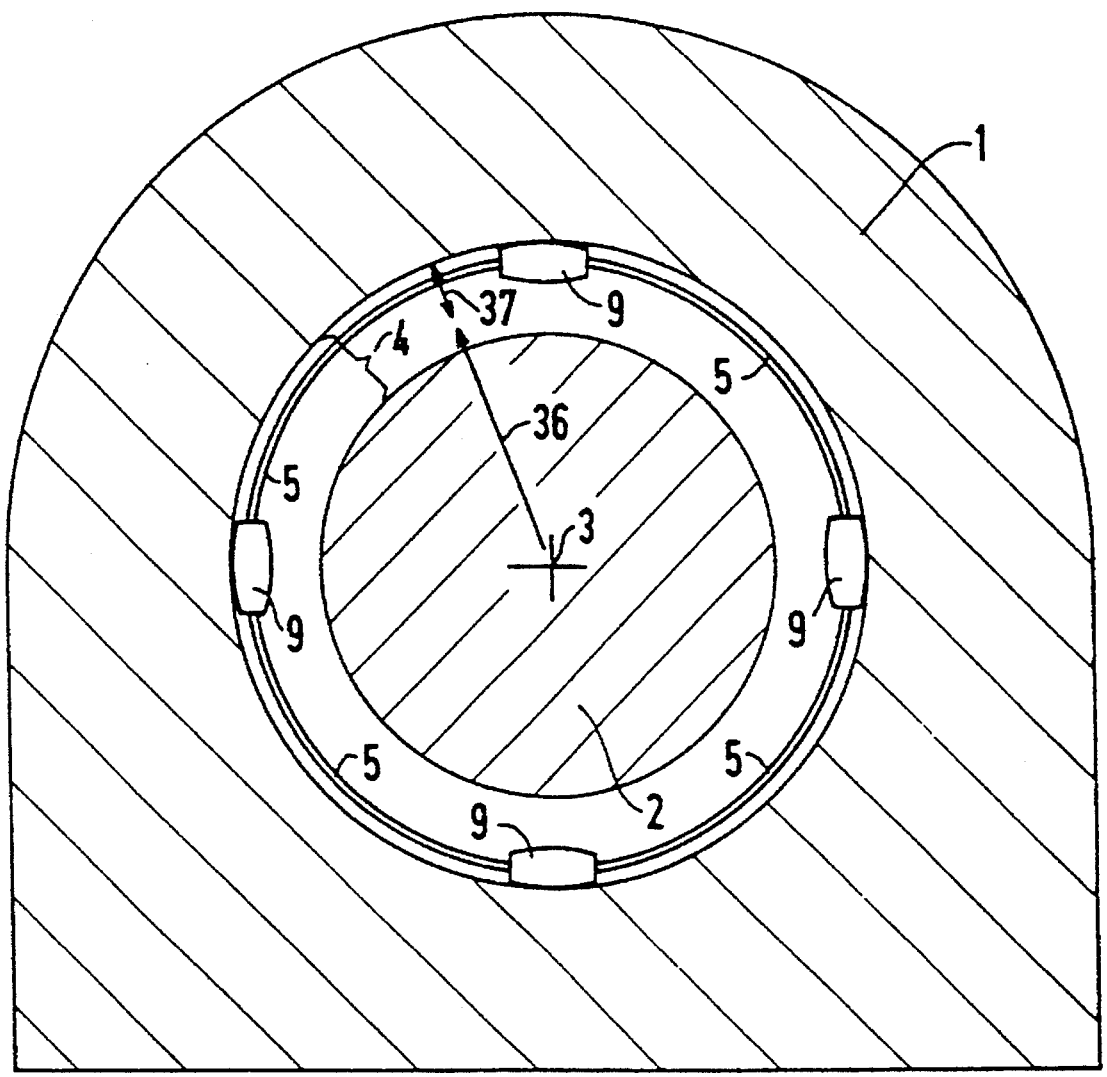
FIG. 1 is a diagrammatic, longitudinal-sectional view of a dynamoelectric machine having an instrument carrier according to the invention.

Referring now to the figures of the drawing in detail and first, particularly, to FIG. 1 thereof, there is seen a sectional view of a dynamoelectric machine which is shown perpendicular to a main axis 3. The machine has a stator 1 and a rotor 2 which is disposed in a recess in the stator 1 and is rotatable about the main axis 3, which is indicated by a cross. A gap 4 is located between the stator 1 and the rotor 2. Disposed in this gap 4 is an instrument carrier, of which a frame part 5 and rollers 9 that roll on a surface of the stator 1 in the gap 4, are shown. The invention utilizes the fact that the instrument carrier can be moved without difficulty along the main axis 3 through the gap 4 and can assume any desired position. This instrument carrier requires no support from auxiliary devices which are to be positioned outside the gap 4 and which would cause it to be subjected to unavoidable vibrations and the like. The instrument carrier is supported directly at a point of the stator 1 at which it is currently located, and is thus secure against vibrations. The positioning of the instrument carrier is also particularly simple. The configuration of the instrument carrier, which essentially completely surrounds the main axis 3, also prevents the instrument carrier from tilting when travelling the gap 4 and possibly no longer being directly capable of being removed from the gap 4. The risk of tilting and jamming does not exist by reason of principle in the illustrated instrument carrier. FIG. 1 also illustrates the way in which a maximum thickness 37 (represented as a double arrow) of the instrument carrier is to be determined. The maximum thickness 37 is to be determined along radial directions 36 (an example of which is represented by an arrow) relative to the main axis 3. The maximum thickness 37 is not to be confused with a maximum diameter of the instrument carrier or the like. The maximum thickness 37 is to be determined as the maximum value of the thicknesses to be measured along all possible radial directions 36.

Figure 2:
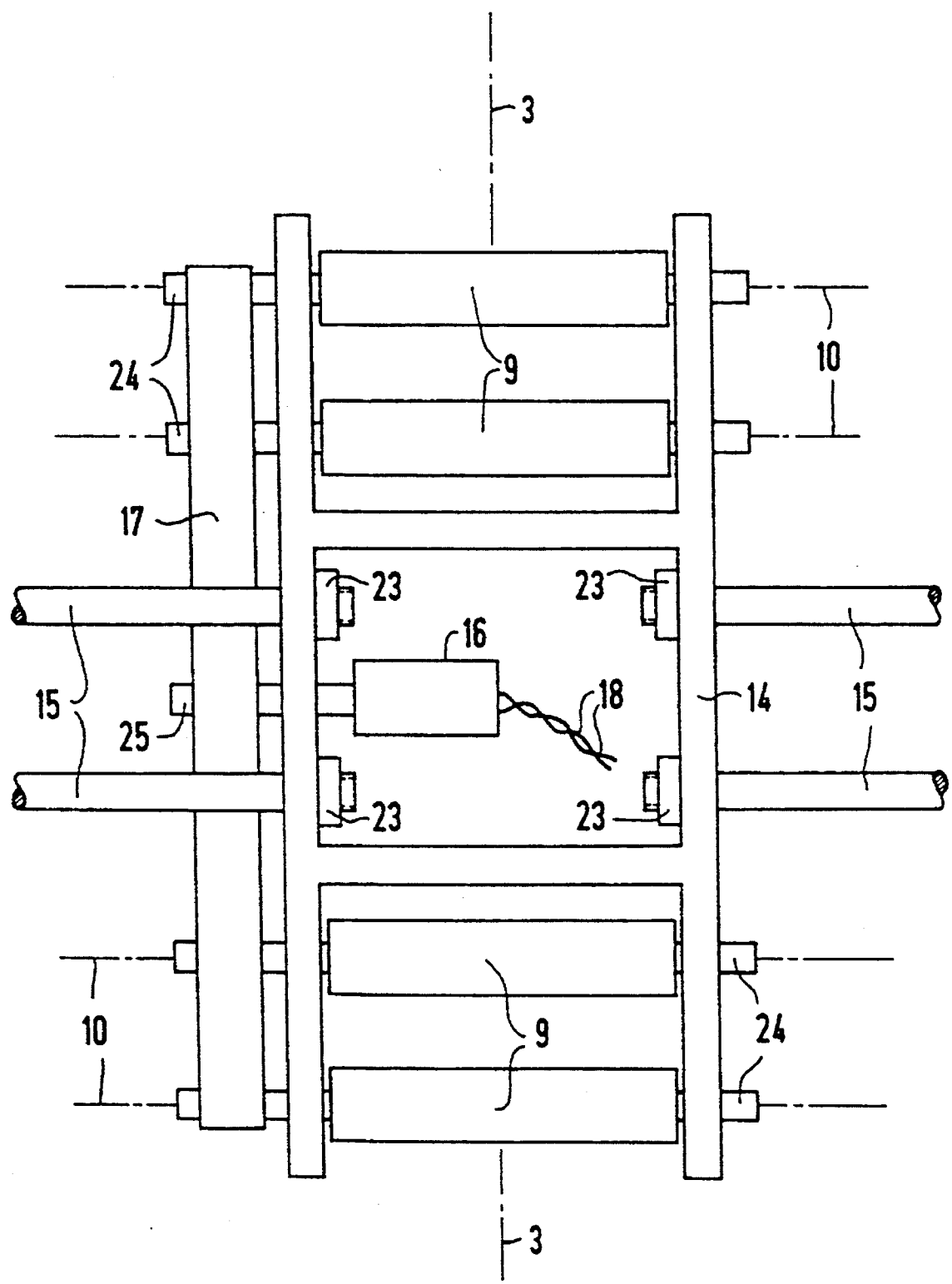
FIG. 2 is a fragmentary, elevational view of an embodiment of the instrument carrier.

FIG. 2 shows a portion of the instrument carrier, as seen perpendicular to the main axis 3. The instrument carrier has four of the rollers 9, which are tightly adjacent one another in pairs and each of which is rotatable about an axis of rotation 10 that is aligned perpendicular to the main axis 3. The rollers 9 are mounted rotatably in a roller frame 14 with which four rods 15 are connected that reach to further roller frames 14 and thus form a frame part together with the latter. The rods 15 are screwed into the roller frame 14 and secured with the aid of mounting means 23, specifically nuts. The rollers 9 can be driven by a first motor 16, preferably an electric motor, which is externally operable through connecting leads 18. A drive band, which is run over an output shaft 25 of the first motor 16 and over appropriately lengthened hubs 24 of the rollers 9, serves as a power-transmitting device 17. Consequently, the instrument carrier with a frame part of the type represented in the fragmentary view of FIG. 2 is a self-propelled device and no longer requires any auxiliary device such as, for example, a cable or a rail for moving along the main axis 3.

Figure 3:
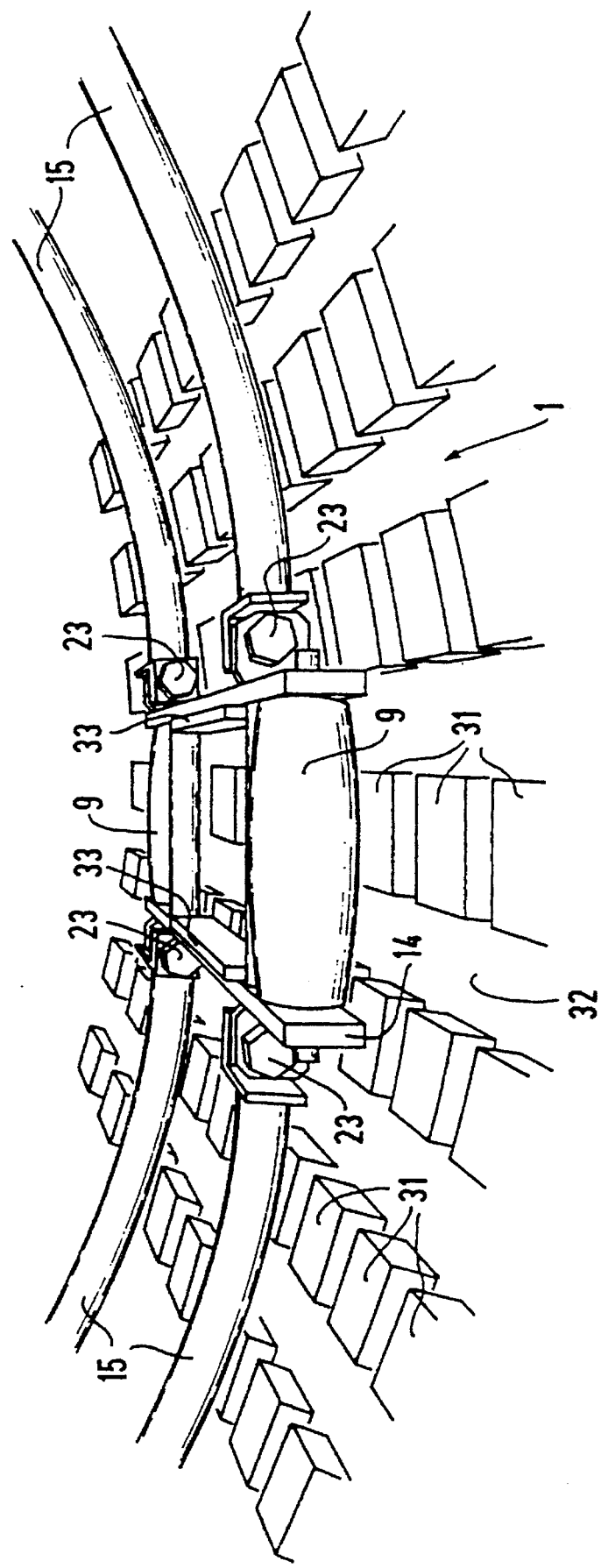
FIG. 3 is a fragmentary, perspective view of an instrument carrier in a stator of a dynamoelectric machine.

FIG. 3 shows a view of an instrument carrier in the recess of the stator 1. The roller frame 14 having the rollers 9 and being adjoined by bent rods 15 is shown. These rods 15 are connected to the roller frame 14 with the aid of mounting means 23, specifically screws. Each roller 9 in the roller frame 14 is curved outwards belly-like or bulge-like in the manner of a barrel in order to prevent an edge on the roller 9 from being able to damage the stator 1. The roller frame 14 also has two skids 33, which face away from the stator 1. The instrument carrier can be seated by means of such skids 33 on an end cap of a non-illustrated rotor 2 projecting from the recess of the stator 1, and can be rotated if required about the main axis 3. In this way, the angular positioning relative to the main axis 3 can be carried out easily, and the instrument carrier can also be brought into a defined position before insertion into the gap 4.

Details of the stator 1 are likewise shown in FIG. 3. Accordingly, it is seen that the stator 1 is not a monolith, but is formed of a multiplicity of stacks 31 of laminations that are disposed one behind another and separated from one another. These stacks 31 of laminations have slots which are sealed by slot seals 32 and contain elements of the electric winding of the stator 1. Due to the configuration of the stacks 31 of laminations and the slot seals 32, the surface of the stator 1 to be travelled by the instrument carrier is by no means uniform, but instead is uneven, which must be taken into account, if necessary, when constructing the instrument carrier. Thus it can be advantageous, in accordance with the type of representation shown in FIG. 2, to use pairs of rollers 9 which are suitably separated from one another, instead of individual rollers 9.

Figure 4:
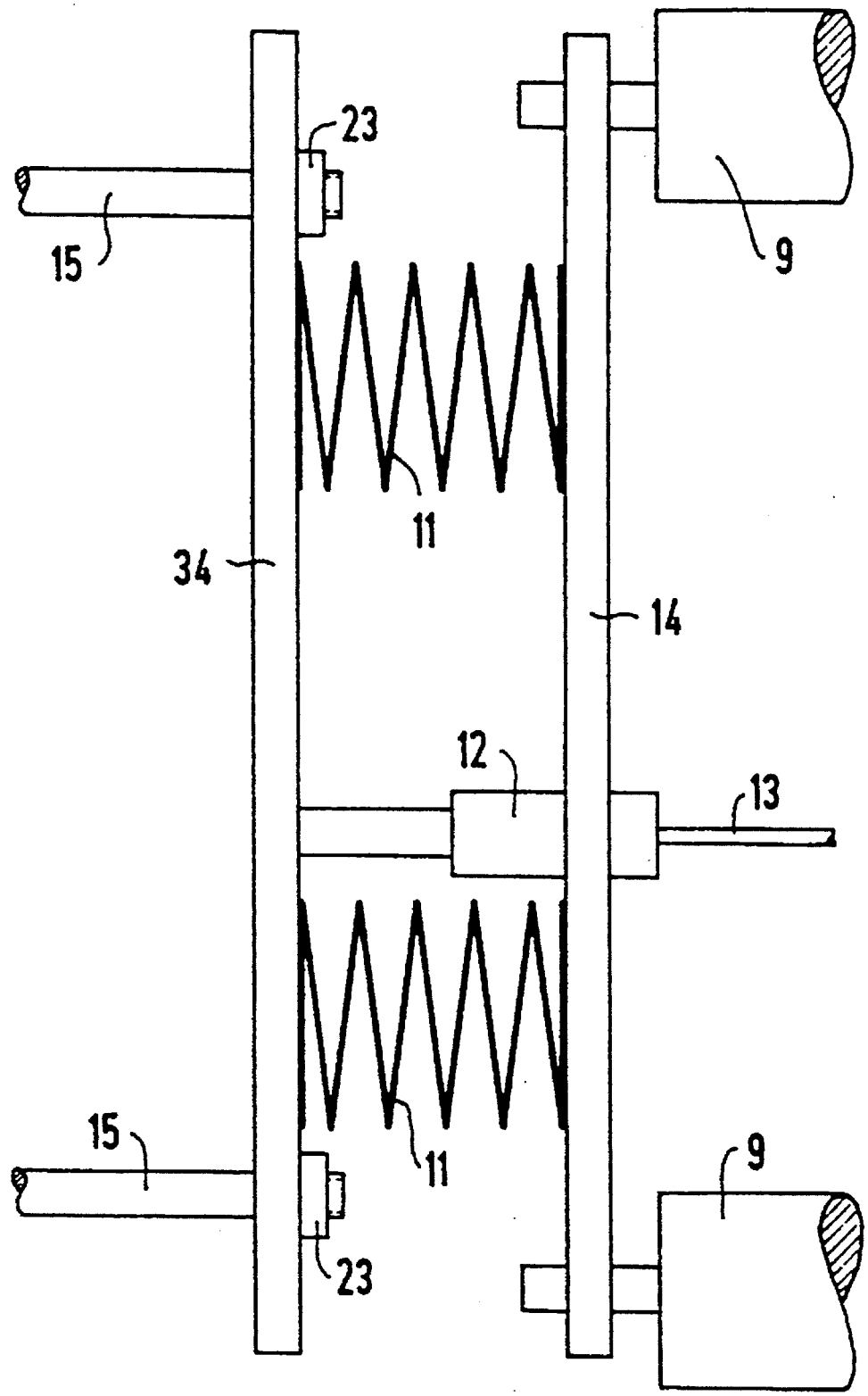
FIG. 4 is a fragmentary, elevational view of a portion of a further embodiment of the instrument carrier.

FIG. 4 shows a portion of a further embodiment of the instrument carrier. Once again, the instrument carrier is constructed from roller frames 14 and rods 15 (as is seen in FIG. 2). However, the rods 15 are not directly mounted on the illustrated roller frame 14, but instead on an additional strip 34 which is disposed alongside the roller frame 14. As was already mentioned in relation to FIG. 2, the rods 15 can be screwed into the additional strip 34 and secured with the aid of additional mounting means 23, in particular nuts. Inserted between the additional strip 34 and the roller frame 14 are two spring elements 11, specifically helical springs, which lend the instrument carrier a certain elasticity and permit a change in its circumference in the radial orientation relative to the main axis 3. Adaptation to irregularities in the stator is thereby possible. Furthermore, disposed between the additional strip 34 and the roller frame 14 is an expansion device 12, specifically a pneumatic reciprocating piston, which is externally operable through a connecting lead 13 and permits variation in an equilibrium distance between the additional strip 34 and the roller frame 14. Deliberate setting of the circumference of the instrument carrier is thereby possible, and it can be matched to the gap 4 which has changing dimensions. Moreover, after termination of the inspection, the instrument carrier can be drawn together somewhat by means of the expansion device 12, in order to ease its removal from the gap 4.

Figure 5:
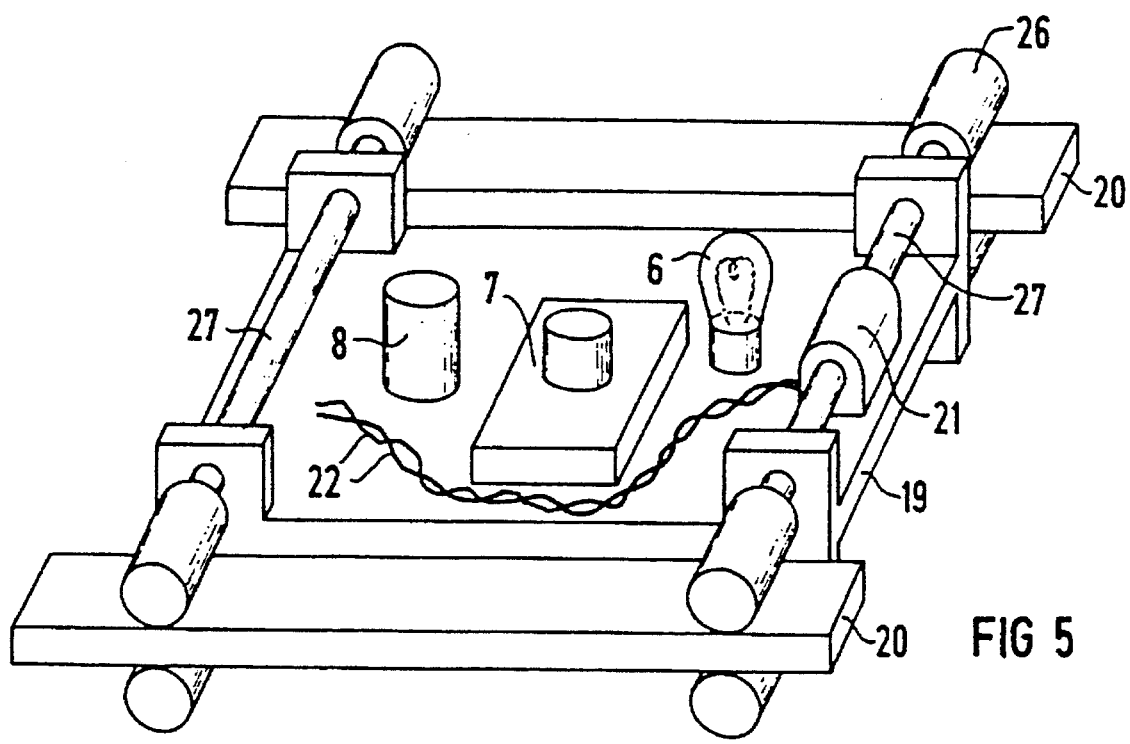
FIG. 5 is a fragmentary, perspective view of an instrument platform for use in the instrument carrier.

FIG. 5 shows an instrument platform 19 which can rotate along two guide rails 20 about the main axis 3 in the gap 4. The instrument platform 19 is held on other rollers 26 which embrace a guide rail 20 in pairs. In order to improve positional accuracy, the other rollers 26 and the guide rails 20 can be toothed. The instrument platform 19 is driven by another motor 21, which is externally operable through an associated connecting lead 22 and drives an axle 27 between the two rollers 26. For example, the instrument platform 19 has a lamp 6, a camera 7 and an ultrasonic test head 8. These three means 6, 7, 8 are representative of the entire multiplicity of instruments and auxiliary devices for carrying out inspections. These means are, of course, connected to connecting leads and operating devices which are not shown for the sake of clarity.

Figure 6:
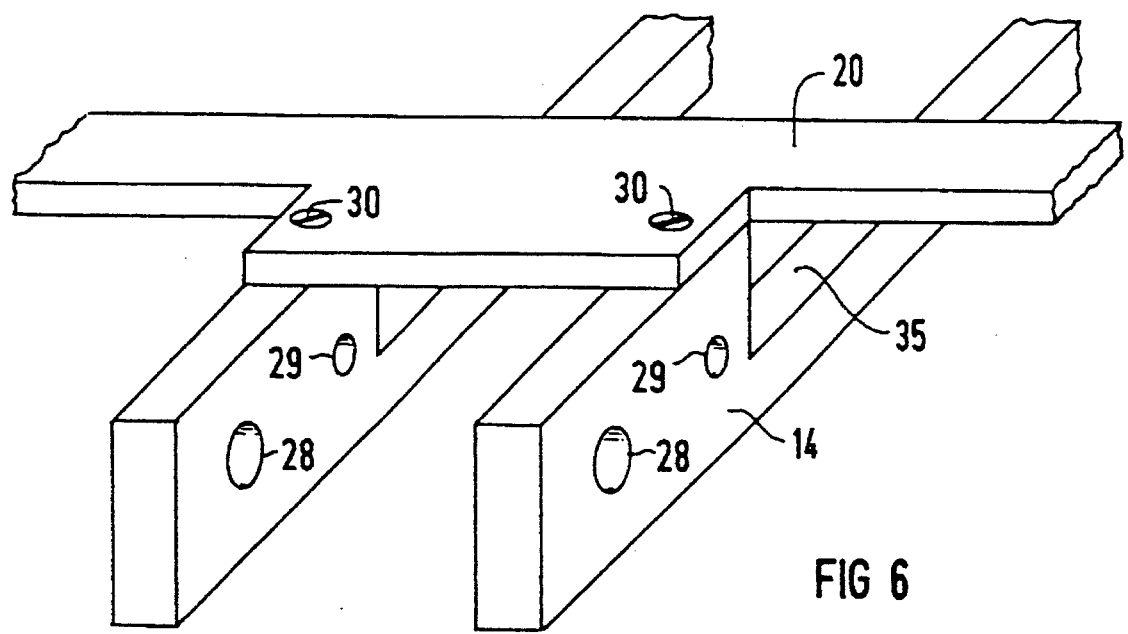
FIG. 6 is a fragmentary, perspective view of a portion of a further embodiment of the instrument carrier.

FIG. 6 shows a partial view of a wheel frame 14 on which a guide rail 20 for guiding an instrument platform 19 of the type represented in FIG. 5 is mounted. The guide rail 20 is mounted on the roller frame 14 by means of screws 30. In order to insert the rollers 9 and the bars 15, the roller frame has corresponding bores 28 and 29. In order for an instrument platform 19 to be able to pass the roller frame 14, the latter is provided with appropriate recesses 35. The guide rail 20 projects into these recesses 35, with sufficient room remaining above and below the guide rail 20 for the instrument platform 19 to be able to pass.

I claim:

1. In a dynamoelectric machine including a stator having a main axis and having a recess formed therein being approximately circular cylindrical relative to the main axis, and a rotor being approximately circularly cylindrically disposed relative to the main axis and being rotatable about the main axis in the recess, defining a gap in the recess between the stator and the rotor, an instrument carrier for inspecting the dynamoelectric machine, comprising:

an instrument carrier axis being brought into coincidence with the main axis during inspection;

a frame part annularly surrounding the instrument carrier axis;

inspecting means being mounted on said frame part; and a multiplicity of rollers being mounted on said frame part, being mutually offset as seen in a plane perpendicular to the instrument carrier axis, and being rotatable about axes of rotation aligned substantially perpendicular to the instrument carrier axis.

2. The instrument carrier according to claim 1, wherein said frame part has means for radially elastically expanding relative to the main axis.

3. The instrument carrier according to claim 2, wherein said expanding means include at least one spring element being elastic in tangential direction relative to the main axis.

4. The instrument carrier according to claim 3, wherein said at least one spring element is at least two but no more than three spring elements.

5. The instrument carrier according to claim 2, wherein said expanding means include at least one expansion device for radially expanding said frame part, said at least one expansion device having connecting leads for operating said at least one expansion device from outside the dynamoelectric machine.

6. The instrument carrier according to claim 5, wherein said expansion device is a pneumatic sliding device acting in an approximately tangential direction relative to the main axis.

7. The instrument carrier according to claim 1, wherein said frame part includes:

a) a multiplicity of roller frames each carrying a plurality of said rollers one behind another relative to the main axis; and b) a multiplicity of bent rods interconnecting said roller frames.

8. The instrument carrier according to claim 7, wherein said multiplicity of roller frames are between four and eight roller frames.

9. The instrument carrier according to claim 7, wherein said multiplicity of roller frames are six roller frames.

10. The instrument carrier according to claim 7, wherein each two of said roller frames are interconnected by two respective approximately mutually parallel rods of said multiplicity of bent rods.

11. The instrument carrier according to claim 7, wherein each of said rods is formed of an elastically flexible material.

12. The instrument carrier according to claim 1, wherein each of said rollers has ends and a middle being bulged outwards relative to said ends.

13. The instrument carrier according to claim 1, wherein each two of said rollers are disposed one behind another relative to the main axis and are tightly adjacent one another.

14. The instrument carrier according to claim 1, including a motor, power-transmitting devices for driving at least one of said rollers with said motor, and a connecting lead for operating said motor from outside the dynamoelectric machine.

15. The instrument carrier according to claim 14, wherein said frame part includes a roller frame having a plurality of said rollers disposed one behind another relative to the main axis, said motor being installed in said roller frame for driving said rollers.

16. The instrument carrier according to claim 1, including an instrument platform being held on said frame part, being movable along said frame part about the main axis, and carrying said inspecting means.

17. The instrument carrier according to claim 16, wherein said frame part has at least one guide rail on which said instrument platform is held.

18. The instrument carrier according to claim 17, wherein said instrument platform has a motor being force-lockingly connected to said at least one guide rail for moving said instrument platform, said motor having a connecting lead for operating said motor from outside the dynamoelectric machine.

19. The instrument carrier according to claim 16, wherein said instrument platform has a motor being force-lockingly connected to said frame part for moving said instrument platform, said motor having a connecting lead for operating said motor from outside the dynamoelectric machine.

20. The instrument carrier according to claim 1, wherein the instrument carrier has a maximum thickness being smaller than 10 cm as measured relative to the main axis in a radial direction.

21. The instrument carrier according to claim 1, wherein the instrument carrier has a maximum thickness being smaller than 5 cm as measured relative to the main axis in a radial direction.

22. In a method for inspecting a dynamoelectric machine including a stator having a main axis and having a recess formed therein being approximately circular cylindrical relative to the main axis, and a rotor being approximately circularly cylindrically disposed relative to the main axis and being rotatable about the main axis in the recess, defining a gap in the recess between the stator and the rotor, the improvement which comprises:

mounting inspecting means on a frame part of an instrument carrier having an axis being annularly surrounded by the frame part;

mounting a multiplicity of rollers on the frame part, with a mutual offset as seen in a plane perpendicular to the instrument carrier axis;

inserting the instrument carrier into the gap between the stator and the rotor while surrounding the rotor with the frame part;

bringing the instrument carrier axis into coincidence with the main axis during inspection; and rolling the rollers over the stator in the recess while rotating the rollers about axes of rotation aligned substantially perpendicular to the instrument carrier axis.

23. The method according to claim 22, which comprises driving the instrument carrier along the main axis with a motor of the instrument carrier being operable from outside the dynamoelectric machine through an associated connecting lead.

24. The method according to claim 22, which comprises mounting the inspecting means on an instrument platform of the instrument carrier, and driving the instrument platform about the main axis with a motor being operated from outside the dynamoelectric machine through an associated connecting lead.

25. The method according to claim 23, which comprises mounting the inspecting means on an instrument platform of the instrument carrier, and driving the instrument platform about the main axis with another motor being operated from outside the dynamoelectric machine through an associated connecting lead.

26. An instrument carrier for inspecting a dynamoelectric machine including a stator having a main axis and having a recess formed therein being approximately circular cylindrical relative to the main axis, and a rotor being approximately circularly cylindrically disposed relative to the main axis and being rotatable about the main axis in the recess, defining a gap in the recess between the stator and the rotor, the instrument carrier comprising:

an instrument carrier axis being brought into coincidence with the main axis during inspection;

a frame part annularly surrounding the instrument carrier axis; inspecting means being mounted on said frame part; and a multiplicity of rollers being mounted on said frame part, being mutually offset as seen in a plane perpendicular to the instrument carrier axis, and being rotatable about axes of rotation aligned substantially perpendicular to the instrument carrier axis.

* * * * *